March 15, 1966 M. MICHELITSCH 3,240,571

SEMICONDUCTOR DEVICE AND METHOD OF PRODUCING IT

Filed Dec. 19, 1961

INVENTOR.
MICHAEL MICHELITSCH
BY Philip M. Bolton
ATTORNEY

United States Patent Office 3,240,571

Patented Mar. 15, 1966

3,240,571

SEMICONDUCTOR DEVICE AND METHOD OF PRODUCING IT

Michael Michelitsch, Wappingers Falls, N.Y., assignor to International Standard Electric Corporation, New York, N.Y., a corporation of Delaware Filed Dec. 19, 1961, Ser. No. 160,440
Claims priority, application Germany, Dec. 22, 1960, St 17,264
4 Claims. (Cl. 29—195)

The present invention relates to electrical semiconductor devices, in particular tunnel diodes, also known as Esaki diodes, and the method of producing them by alloying doping substances producing the opposite conductivity, into a semiconductor body of germanium, silicon, or any other similar semiconducting material.

In electrical semiconductor devices, especially in the case of tunnel diodes, a very small capacity of the p-n junction and, at the same time, a low resistance in the forward direction is often required. Hitherto a p-n junction with a small capacity was achieved by removing a large portion of the semiconductor body subsequently to the alloying into said body of doping material which produces the opposite conductivity, thus resulting in a small-surface type of p-n junction. The removal of the material of the semiconductor body was usually carried out by sawing, grinding or etching, which caused the loss of a large portion of the semiconductor material which had been produced in the form of a monocrystal with considerable effort. In addition thereto the removal of the semiconductor material also caused an unwanted increase in the path resistance.

In order to avoid these difficulties a method is proposed for producing electrical semiconductor devices, in particular tunnel diodes, by alloying doping substances into a semiconductor body of germanium, silicon, or any other similar semiconductor, which method is characterised by the fact that a highly doped semiconductor body is brought into contact with a metal electrode, provided with a thin coating of doping substances which produce an opposite conductivity, in such a manner a small contacting area between the semiconductor body and the coating will be obtained, and by the fact that the device is heated to such an extent that the coating substance is alloyed into the semiconductor body at the point of contact and a p-n junction is produced in close proximity to the point of contact.

The above mentioned and other features and objects of this invention and the manner of attaining them will become more apparent, and the invention itself will be best understood, by reference to the following descriptions of several embodiments of the invention taken in conjunction with the accompanying drawings, in which.

Figure 1:
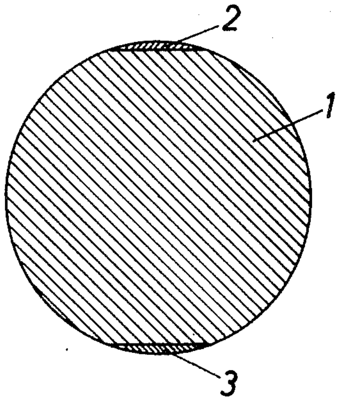
FIG. 1 is a cross-sectional view of a ball-shaped semiconductor body of the invention.

Since the method, according to the invention, employs a previously shaped semiconductor body of which no parts have to be removed after the p-n junction has been produced, the step of the manufacturing process concerned with removing the surplus material is not only saved, but no semiconductor material is lost or wasted. Moreover, due to the small contact surface between the semiconductor body and the doping substance, a p-n junction with a very small surface area is obtained, so that the capacity of the p-n junction will remain small. The size of the p-n junction may be determined, in accordance with the inventive method, in a simple way by the thickness of the coating of doping material producing an opposite conductivity on the electrode, as well as by the duration and temperature of the heat treatment. In this way it is possible to produce p-n junctions of very small dimensions with the aid of simple means.

At the same time the semiconductor body may have a shape by which it will be possible to achieve a low path resistance, i.e., the semiconductor body may have a cross-section which, along its longitudinal expansion, is greater than the surface of the p-n junction.

In the method, according to the invention, and due to the fact that the alloying substance is used as a coating on a metal electrode, an electrode is fixed to the semiconductor body at the same time.

Furthermore, the method, according to the invention, can be carried out in such a way that further electrodes may also be joined to the semiconductor body in the course of one single step of the process. This is accomplished in that metal electrodes of suitable size and shape are provided with the respective coatings of doping material are brought into contact with the semiconductor body, and in that these electrodes are combined with the semiconductor body in the course of one single heating process and with the aid of the coatings of doping material. A p-n junction is then obtained in the vicinity of the electrodes which are coated with a doping substance producing an opposite conductivity, by way of alloying the doping substance, whereas, in the case of electrodes provided with a coating of a doping material producing the same conductivity, or with a coating a non-doping material, ohmic or resistance junctions are formed so that these electrodes will not establish a rectifying contact with the semiconductor body.

When producing tunnel diodes, a suitably shaped highly doped, semiconductor body is arranged in such a way between two electrodes as to establish a contact with these electrodes at points which are provided with a coating of a doping material. One of these electrodes is provided with a coating of a doping material producing an opposite conductivity, whereas the second electrode is provided with a coating of a doping material producing the same conductivity. In the course of a heating process, the two coatings are heated in excess of their melting points and are thus alloyed into the semiconductor material at their respective points of contact, so that on one side, a p-n junction is formed in the close vicinity of the electrode, while an ohmic junction is formed on the other side. The semiconductor body is so arranged that at the point where the p-n junction is formed only a small surface of contact or contact area with the doping layer will result, so that a p-n junction of small size will be obtained.

The contact area of the semiconductor body provided with a coating of a doping substance producing the same conductivity may have the same size as the first contact area, but it may prove to be convenient for the contact area at which the ohmic contact is established to be greater than the first contact area.

The semiconductor body already has its final shape prior to being subjected to the alloying process. The shape should be so chosen that at least the point of contact of the semiconductor body provided with the coating layer of doping susbtance is small.

For example, semiconductor bodies in the shape of small balls may be used, while the associated electrodes are designed as plane surfaces. This results in small contacting surfaces between both the coating of doping material producing the opposite conductivity and the coating of doping material producing the same conductivity. In manufacturing tunnel diodes, semiconductor bodies are used which are highly doped in a well-known manner and which have a relatively small size, quite depending on the expected load. Thus, for example, tunnel diodes for high-frequency purposes can be produced from ball-shaped semiconductor bodies of highly doped germanium having a diameter in the order of 20 to 30 microns.

Due to the large central cross-section of the semiconductor body, such a tunnel diode has a relatively low series resistance. However, if the semiconductor body is reduced in size in a well-known manner by etching subsequently to producing the p-n junction, then the cross-section of the semiconductor is reduced to a greater extent at a greater distance from the electrodes than nearer to the electrodes, so that the cross-section of the semiconductor body between the electrodes will be smaller than than at the points of contact and, consequently, smaller than the area of the p-n junction. With respect to high-frequency applications, this results in an unwanted high series resistance.

It is likewise possible to use semiconductor bodies of any other shape, as long as the point of contact of the semiconductor body provided with the coating of the doping material producing the opposite conductivity is a small one and that the cross-section of the remaining semiconductor body is at least as large as the surface of the p-n junction. Thus, for example, it is possible to use semiconductor bodies having the shape of a cone or of a pyramid, or else of a truncated pyramid. For carrying out the method, according to the invention, it is also possible to use semiconductor bodies which are provided with a projection having a small cross-section on which the p-n junction is produced. Finally, it is also possible to use a suitably shaped electrode in order to obtain a small contacting surface.

Suitable types of semiconductor bodies are appropriately produced in such a way that there is no need for any material having to be removed. Such types having small balls of a semiconducting material can be produced, by way of example, by permitting the semiconductor material to drip out of a narrow opening or by spraying liquid semiconducting material with the aid of a suitable gas stream. A further possibility resides in the fact of varying the drawing speed while drawing a mono- or single-crystal from a melt, so that the cross-section of the drawn semiconductor crystal is alternately enlarged and reduced. By sawing this crystal apart it is possible to obtain cone-shaped semiconductor bodies.

Another possibility of obtaining small balls of semiconductor material is to heat a powder or a granular mass of semiconducting material in the course of which the semiconducting material that has been heated beyond the melting point, is contracted to the shape of small balls, due to the surface tension produced by the heating.

Metal wafers of suitable shape and suitable material are used as electrodes. These are provided on the side where they establish the contact with the semiconductor body with a coating of either a doping or a neutral substance which alloys with the semiconducting material. Since it is appropriate to produce several contacts at the same time, it is of advantage, when selecting the coating substances, to see that they not only possess the desired doping properties, but also to see that the temperature ranges necessary for producing the respective alloys with the semiconducting material are not too far apart.

The coatings adapted to be applied to the electrodes can be produced in the conventional manner, e.g., by evaporating the coating material in vacuo. It is not absolutely necessary to coat the entire electrode surface with the substance to be alloyed, but it is sufficient to deposit the coating substance in the vicinity of the point where the contact is established with the semiconductor body.

For producing germanium types of tunnel diodes, for example, electrode wafers of copper are used, one of which is coated with tin and the other one is provided with a coating of a tin-arsenic alloy, containing, e.g., 95 percent tin and 5 percent arsenic. Between these two electrode wafers a small ball of strongly p-doped germanium is arranged in contact with the two coatings. In the course of a heating process, the two coating layers are alloyed into the semiconductor body, so that a p-n junction is formed in the germanium in close proximity to the electrode wafer which is provided with the tin-arsenic coating. Due to the small contact area of the little ball with the coating layer, the expansion of the p-n junction and, consequently, the capacity of the junction are very small, the series resistance of the thus obtained tunnel diode is also low, because the cross-section of the semiconductor body between the electrodes is greater than the dimension of the p-n junction.

The alloying depth is determined by the thickness of the coating layer, as well as by the temperature and duration of the alloying process. In many cases it is convenient to arrange spacing bodies between the electrode wafers during the alloying process, in order to prevent the coating material from alloying too deeply into the semiconductor body and to prevent the p-n junction from becoming too large. Such spacing bodies are appropriately made of insulating material and may also remain between the electrode wafers after the alloying process has been completed. When using, for example, annular or toroidal spacing bodies of ceramic material which are metallized at their face sides, then the face sides of the small ceramic tube are soldered to the coating layer on the electrode wafer during the heating process, so that at the same time a perfect sealing of the semiconductor from the surroundings is achieved.

However, the space between the electrode wafers may also be filled after the alloying process by using a suitable insulating material, such as a cold-setting casting resin. Care has to be taken, however, that no pressure is exerted upon the insides of the electrodes by the hardening or setting process, as this may cause the electrodes to be removed from the semiconductor body.

It is appropriate to use electrode wafers consisting of a material with good heat-conducting properties, such as copper or silver.

If the ohmic contact is made to have a surface which is large with respect to that of the rectifying contact, it is suitable to select a metal or an alloy for the ohmic electrode which has an expansion coefficient similar to that of the semiconductor material.

Referring to FIG. 1, a cross-sectional view is shown of a ball-shaped semiconductor body 1 on the top side of which a highly doped conversion layer 2 has been produced by way of alloying. Between the highly doped semiconductor body 1 and the highly doped conversion layer 2, a p-n junction of small size is located. On the opposite side of the body 1, an ohmic contact 3 is arranged on the semiconductor body means of alloying.

Figure 2:
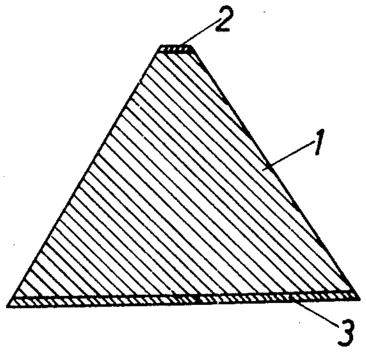
FIG. 2 is a cross-sectional view of a modified shape of the semiconductor body.

In FIG. 2, the cross-sectional view of another shape of the semiconductor body is shown. The semiconductor body 1, as shown in this FIG. 2, has the shape of either a truncated cone or of a truncated pyramid. A conversion layer 2 is provided on the small face side, whereas the ohmic contact 3 on the base of the body has a substantially larger area than the p-n junction.

Figure 3:
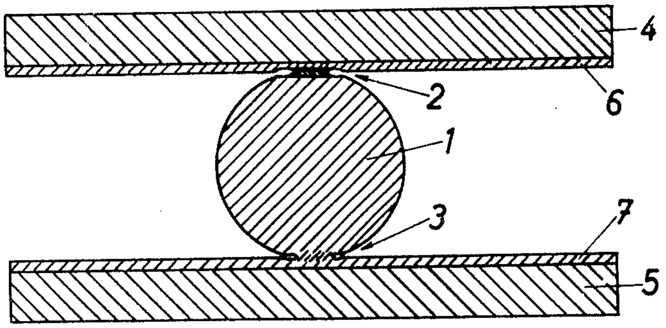
FIG. 3 is a cross-sectional view of a small ball of semiconductor material which has been joined to the coating layers of electrode wafers.

FIG. 3 shows a small ball 1 of semiconductor material which has been joined to the coating layers 6 and 7 on the two small electrode wafers 4 and 5 by alloying. By alloying the doping substance 6, which produces the opposite conductivity, a conversion layer of small size is formed at the point denoted by the reference numeral 2, while the connection 3 between the semiconductor body 1 and the coating layer 7 establishes an ohmic contact. As already mentioned hereinbefore, the space between the two electrode wafers may be filled with a suitable insulating material.

The subject matter of the application, however, is in no way restricted to the embodiments as shown and described herein.

As also already mentioned hereinbefore, it is possible to use semiconductor bodies with shapes other than that shown and described herein, and it is also possible to provide or attach several rectifying and ohmic contacts to one single semiconductor body. In any case it is essential that the point of contact between the semiconductor body and the coating layer of an electrode forming a rectifying contact is a small one, and that the cross-section of the semiconductor body between the electrodes is not smaller than the area of the p-n junction.

Likewise, the invention is in no way restricted to the employment of germanium as the semiconductor.

I claim:

1. A semiconductor device comprising a highly doped semiconductor body, an extended area electrode for said body, a thin coating on said electrode of a metal containing an impurity that will produce a conductivity opposite to that of said body, said body having a cross-section at one end smaller than that of the body away from said end and a very small surface area at said end in contact with the coating on said electrode, the area of said coating and electrode extending beyond said contact area, an alloyed portion joining said electrode with said body at said small surface area, a p-n junction in said alloyed portion in close proximity to the area of contact, a second extended area electrode, a thin coating on an extended area of said second electrode of a metal containing an impurity that will produce the same conductivity as the semiconductor body, said body having another surface area in contact with the coating on said second electrode, a second alloyed portion joining said last-mentioned electrode with said body to form an ohmic contact between said body and said second electrode, said electrodes being wafer-shaped and said semiconductor body being of highly doped p-type germanium, the metal coating on the electrode adjacent the p-n junction being an alloy of approximately 95 percent tin and 5 percent arsenic and the n layer of said junction being a recrystallized region of said alloy on said body.

2. A semiconductor device, as defined in claim 1, in which the semiconductor body is in the shape of a cone with the p-n junction at the apex thereof.

3. A semiconductor device, as defined in claim 1, in which the semiconductor body is in the shape of a pyramid with the p-n junction at the apex thereof.

4. A semiconductor device, as defined in claim 1, in which the semiconductor body is in the shape of a ball.

References Cited by the Examiner

UNITED STATES PATENTS

| | | | |
|---|---|---|---|
| 2,836,523 | 5/1958 | Fuller | 148—33.6 X |
| 2,894,184 | 7/1959 | Veach et al. | 148—1.5 X |
| 2,906,932 | 9/1959 | Fedotowsky | 148—33.6 X |
| 2,918,719 | 12/1959 | Armstrong | 148—1.5 |
| 2,934,685 | 4/1960 | Jones | 148—1.5 X |
| 2,937,110 | 5/1960 | John | 148—33 X |
| 2,943,006 | 6/1960 | Henkels | 148—1.5 |
| 2,993,155 | 7/1961 | Gotzberger | 317—234 |
| 3,033,714 | 5/1962 | Ezaki et al. | 148—33 |
| 3,110,849 | 11/1963 | Soltys | 317—234 |

DAVID L. RECK, *Primary Examiner.*